United States Patent [19]
Mikkelsen, Jr. et al.

[11] Patent Number: 5,229,595
[45] Date of Patent: Jul. 20, 1993

[54] FLUID-FILLED COLOR FILTERED INPUT SCANNER ARRAYS

[75] Inventors: James C. Mikkelsen, Jr., Los Altos; William Turner, San Marino, both of Calif.

[73] Assignee: Xerox Corporation, Stamford, Conn.

[21] Appl. No.: 810,654

[22] Filed: Dec. 19, 1991

[51] Int. Cl.$^5$ .................. H01J 40/14; G01J 3/50; H01L 27/14
[52] U.S. Cl. .................. 250/208.1; 250/226; 259/440; 359/886
[58] Field of Search .............. 250/208.1, 226; 359/885, 886, 891; 357/30 L, 30 H; 257/440, 432

[56] References Cited

U.S. PATENT DOCUMENTS

| | | |
|---|---|---|
| 4,029,394 | 6/1977 | Araki . |
| 4,047,200 | 9/1977 | Koubek . |
| 4,081,277 | 3/1978 | Brault et al. ............ 250/226 |
| 4,092,632 | 5/1978 | Agulnek . |
| 4,122,352 | 10/1978 | Crean et al. . |
| 4,146,786 | 3/1979 | Agulnek . |
| 4,149,091 | 4/1979 | Crean et al. . |
| 4,204,866 | 5/1980 | Horak et al. ............ 250/208.1 |
| 4,368,484 | 1/1983 | Stemme et al. . |
| 4,370,025 | 1/1983 | Sato et al. . |
| 4,386,143 | 5/1983 | Sato et al. . |
| 4,523,102 | 6/1985 | Kazufumi et al. ............ 250/208.1 |
| 4,667,092 | 5/1987 | Ishihara ............ 250/208.1 |
| 4,725,889 | 2/1988 | Yaniv et al. . |
| 4,728,803 | 3/1988 | Catchpole et al. . |
| 4,739,414 | 4/1988 | Pryor et al. . |
| 4,827,118 | 5/1989 | Shibata et al. ............ 250/226 |
| 5,042,920 | 8/1991 | Yoshino et al. . |
| 5,053,298 | 10/1991 | Park et al. . |

FOREIGN PATENT DOCUMENTS

| | | |
|---|---|---|
| 59-84206(A) | 5/1984 | Japan ............ 359/886 |
| 0124768 | 7/1984 | Japan ............ 357/30 L |
| 0073601 | 4/1985 | Japan ............ 357/30 L |
| 0231702 | 10/1991 | Japan ............ 359/891 |
| 3-280002(A) | 12/1991 | Japan ............ 359/886 |

OTHER PUBLICATIONS

Measuring Colour, R. W. G. Hunt, John Wiley & Sons, New York, 1987, pp. 110-112.
Redetermination of CIE Standard Source C, F. W. Billmeyer, Jr., Color Research and applications, vol. 8, No. 2, Summer 1983, pp. 90-96.

*Primary Examiner*—David C. Nelms
*Assistant Examiner*—Michael Messinger
*Attorney, Agent, or Firm*—Rosen, Dainow & Jacobs

[57] ABSTRACT

A color scanner has a plurality of rows of photosensors. Spacers are formed between and around the rows, and a transparent cover sheet is sealed to the device, to form separate channels. An opening is provided in each otherwise sealed channel. The channels are filled with different colored media by evacuating the channels and letting the vacuum draw in different colored media such as liquids or gels.

9 Claims, 3 Drawing Sheets

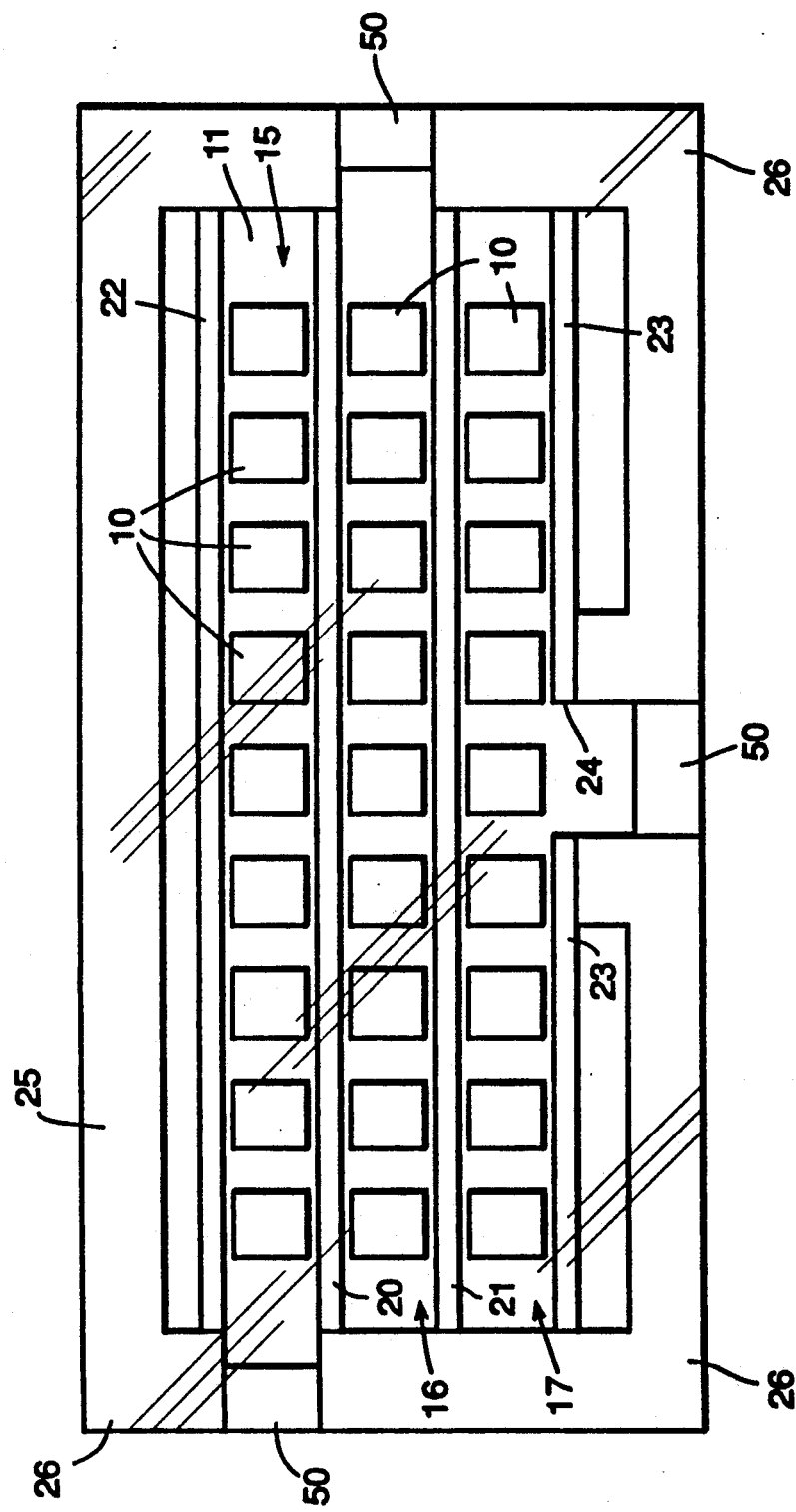

FLUID-FILLED COLOR FILTERED INPUT SCANNER ARRAYS

FIELD OF THE INVENTION

This invention relates to a method for producing a color scanning device, and to a color scanning device produced by the method.

BACKGROUND OF THE INVENTION

It is frequently desired to provide signals corresponding to the colors of an image, for example in color television systems, color reproduction systems, etc. For this purpose, it is necessary to provide a light scanning arrangement that is sensitive to different colors. In one technique for producing such signals, a sensing array is provided having a plurality of light sensing devices, such a photodiodes, arranged to intercept light, for example from scanning optics. Different colored optical filters are arranged in the optical path of the light to the different sensors, so that the output of each sensor is responsive to light of a different color.

In the production of one form of color scanning device, as disclosed for example in U.S. Pat. No. 5,053,298, photodiode arrays are deposited in recesses in a substrate, and covered with a transparent planarizing layer. After a pattern conforming to predetermined ones of the diode arrays is lithographically formed on the surface of the planarizing layer, the planarizing layer is covered with a coloring agent to cover the pattern. The coloring agent is then removed from the surface of the planarizing layer, a protective layer is provided on the colored pattern, and the process is repeated to form other patterns of different color.

The above described process involves a number of photolithographic steps, and the precise alignment of the patterns with the respective diode arrays.

In another method for producing a color scanning device, as disclosed in U.S. Pat. No. 5,042,920, resin inks of different colors are printed on a transparent substrate in the form of patterns, such as stripes. In this process, the color patterns are overcoated with transparent electrodes of the same pattern. Pixel electrodes are formed on a second transparent substrate, and a sandwich is formed of these substrate assemblies, with a liquid crystal layer between the pattern electrodes and the pixel electrodes.

In each of the above techniques for providing color filters for a light scanning devices, the coloring agents are thus applied to external surfaces of the device, which are covered in the final preparation of the device, and the provision of the color filters is relatively complicated and costly.

Liquid color filters have been suggested for use in light sources, wherein color liquids are provided between glass plates, as disclosed e.g. in "Measuring Colour", R. W. G. Hunt, John Wiley & Sons, New York, 1987, pp 110-112, and "Redetermination of CIE Standard Source C", F. W. Billmeyer, Jr., Color research and applications, Volume 8. No. 2, Summer 1983, pp 90-96. These references are directed to devices of macroscopic dimensions (e.g. centimeters) wherein the absorption coefficients of the color liquids are low, for example 1000 times too low to provide effective color filtering in devices of microscopic dimensions, (e.g. of the order of micrometers) such as thin-film scan arrays.

SUMMARY OF THE INVENTION

The present invention is therefore directed to the provision of an improved color scanner device and method for fabricating the device.

Briefly stated, in accordance with the invention, a color scanner has an array of a plurality of spaced apart photosensors arranged on a substrate. The array is separated into a plurality of regions by spacers, and a transparent cover sheet is sealed to the top of the device, so that the spacers space the cover sheet from the substrate and photosensors. The array may be formed by conventional thin-film techniques. The separate regions of the substrate are initially open, at at least one location, to permit evacuation of the respective region. Following evacuation of a region, it is contacted with a flowable liquid color medium, such as a dye, to permit the "vacuum" within the region to draw in the liquid color medium.

The invention thereby enables the various regions of the device to be filled with a color medium in a simple and inexpensive manner, and also readily permits the use of color media that have desired color filter characteristics.

In one embodiment of the invention, a plurality of rows of photosensors are formed on a substrate, and spacers are lithographically formed on the substrate to separate the rows. A transparent cover sheet, for example of glass, is sealed to the top of the device, while leaving an opening leading to each of the rows. In order to apply different color filters to the different rows, each of the rows is evacuated, and the device is positioned to permit the "vacuum" in each channel to draw in a different colored liquid or gel.

BRIEF DESCRIPTION OF THE DRAWING

In order that the invention may be more clearly understood, it will now be disclosed in greater detail with reference to the accompanying drawings, wherein:

FIG. 4 is a top view of a color scanner device in accordance with the invention following sealing of the photosensor channels.

DETAILED DISCLOSURE OF THE INVENTION

Figure 1:
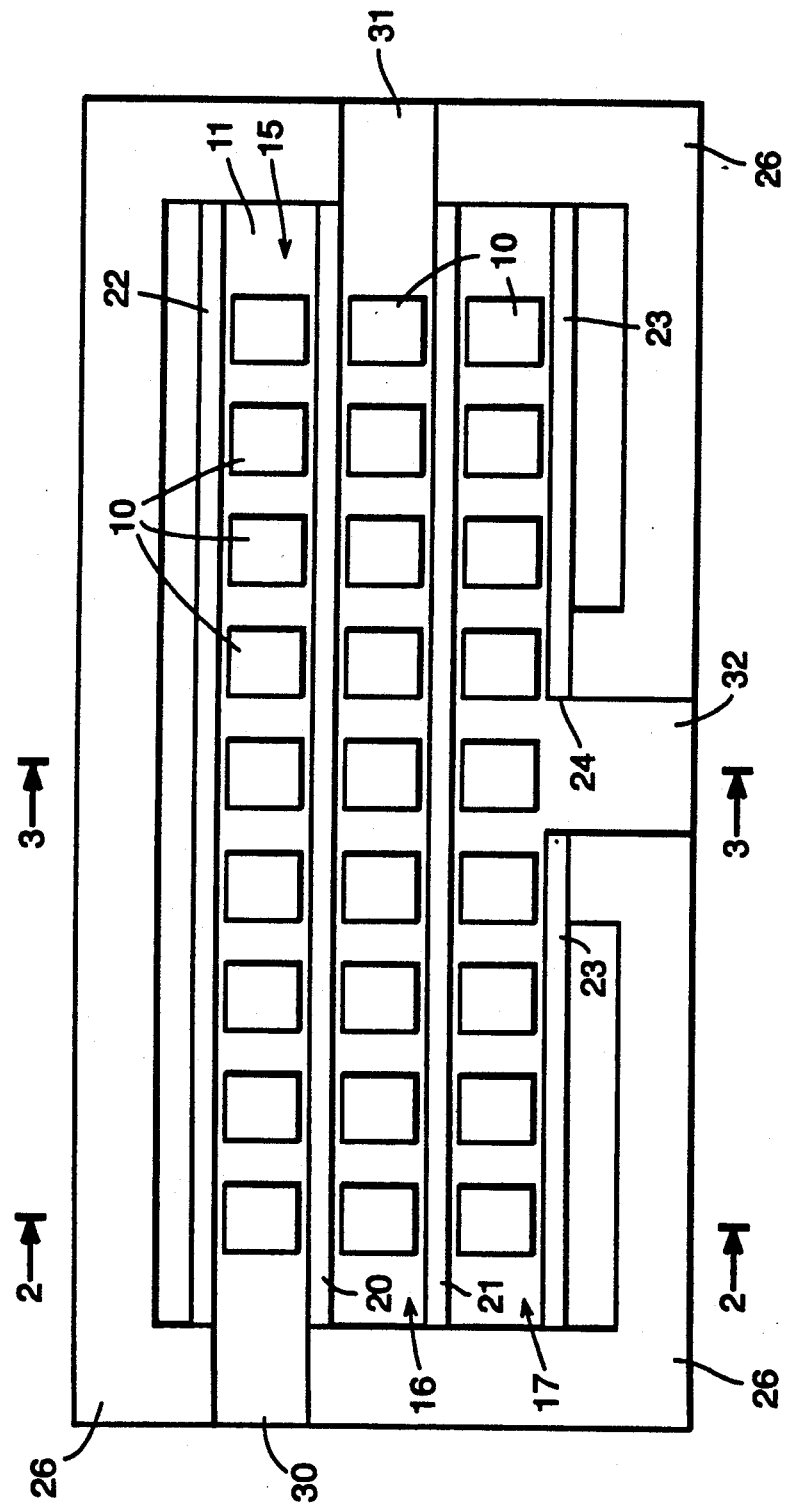
FIG. 1 is a top view of a color scanner device in accordance with the invention, without the cover sheet thereon, prior to filling of the device with color media.
Figure 2:
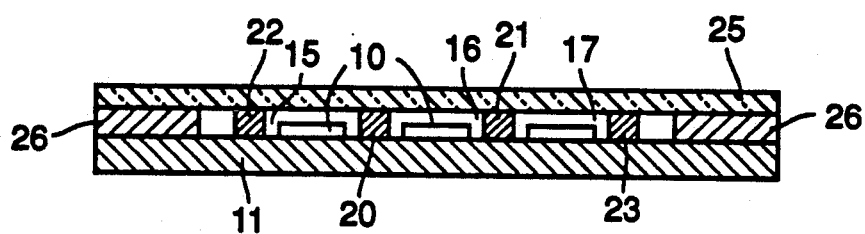
FIG. 2 is a cross sectional view of the color scanner device of FIG. 1, taken along the line 2—2 of FIG. 1, and including the cover sheet.

In accordance with one embodiment of the invention, as illustrated in FIGS. 1 and 2, a plurality of photosensors 10 are formed on an insulating substrate 11, for example by conventional solid state fabrication techniques, such as thin film techniques. In the illustrated embodiment, the photosensors 10 define three separate parallel rows 15, 16, 17 of sensors. The individual sensors are connected in conventional manner to terminals (not illustrated) available for external interconnection of the device, for example via conductive layers (not illustrated) on the substrate.

In addition, the device is lithographically processed to form pattern spacer strips 20, 21 between the photosensor rows 15, 16 and 16, 17, as well as pattern spacer strips 22, 23 outwardly of the rows 15 and 17. These spacers may be formed as a part of a conventional passivation step. The spacer 23 is provided with a central gap 24. The spacers 20-23 support a transparent cover sheet 25, such as glass, in a plane spaced from the substrate and photosensors 10. The periphery of the cover sheet 25 is bonded and sealed to the substrate by a layer 26 of a conventional liquid sealing material extending between the substrate and cover sheet, outwardly of the spacers 20-23.

As illustrated in FIG. 1, the sealing layer 6 extends around the periphery of the device, except for a port or opening 30 aligned with the row 15, a port or opening 31 aligned with the row 16, and a port or opening 32 extending to the gap 24 between the end portions of the spacer 23. The sealing layer 26 extends to the spacers at the respective openings, so that the photosensors in row 15 are in a sealed channel open at the opening 30, the photosensors in row 16 are in a sealed channel open at the opening 31, and the photosensors in row 17 are in a sealed channel open at the opening 32. As illustrated, it is preferred that the openings 30 and 31 be provided at opposite ends of the device, to facilitate the filling of these two channels with a color medium.

In order to provide a color medium in the channels, to thereby filter the light directed to the photosensors 10 via the transparent cover sheet 25, the channels are preferably initially evacuated, to permit the "vacuum" to draw color media fluids into the channels, in a manner similar to that used in the application of liquid crystal material to display panels.

Figure 3:
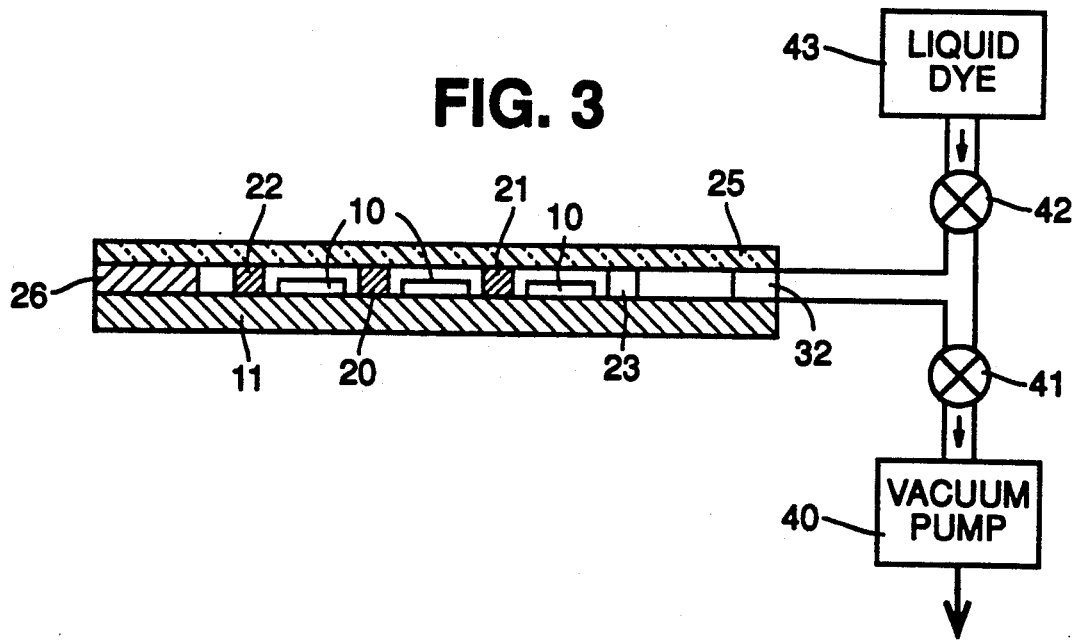
FIG. 3 is a cross sectional view of the color scanner array of FIG. 1 taken along the line 3—3 of FIG. 1, and illustrating one technique for introducing flowable media into the array.

For example, as illustrated in FIG. 3, an opening in the sealing material, such as the opening 32, may be coupled to a pump 40 via a valve 41, to permit the respective channel to be evacuated. After evacuation, the valve 41 is closed and a valve 42 is opened, to permit the "vacuum" in the channel to draw in colored liquid from a supply 43 of colored liquid. After the colored liquid has been drawn into the channel, the channel is sealed by a conventional liquid sealing material 50, as illustrated in FIG. 4.

It is of course apparent that the above described technique is only exemplary, and that any conventional technique may be employed to evacuate the channels so that a colored liquid may be drawn therein by the resultant vacuum. For example, the device may be placed in a chamber, and the chamber then evacuated. In this technique, each of the openings in the device is then brought into contact with a separate one of three sources of colored fluid.

The liquid, i.e. flowable, color media may be any of various materials. For example, UV curable epoxy dyes may be employed, and cured after filling in the device, in order to improve the mechanical stability of the device. Alternatively, colored gels may be employed in order to provide better color fidelity. Such materials provide superior matching to sensor performance, as compared with existing colored polyimides.

The invention thereby provides an improved technique for producing a color scanner that not only simplifies the fabrication of the scanner, but also readily permits the use of better color filter materials. The resultant color scanner device thereby is more readily adaptable to sensing of the desired colors. The device may be a thin-film device, formed by thin-film techniques, and having dimensions of the order of micrometers.

While the invention has been disclosed and described with reference to a single embodiment, it will be apparent that variations and modification may be made therein, and it is therefore intended in the following claims to cover each such variation and modification as falls within the true spirit and scope of the invention.

What is claimed is:

1. A color scanning array comprising a substrate, a plurality of spaced apart photosensor arrays each comprising discrete photosensitive devices on said substrate, spacer means separating said arrays into respective channels each having a port, a transparent layer supported on said spacers and sealed to said substrate, a different colored flowable color medium filling each of said channels and located between all of the photosensitive devices in each said channel and the transparent layer.

2. The color scanning array of claim 1 wherein said flowable color media are colored gels.

3. The color scanning array of claim 1 wherein said array comprises a thin-film array.

4. A color scanning array comprising a substrate, a plurality of spaced apart photosensor arrays each comprising discrete photosensitive devices on said substrate, spacer means separating said arrays into respective channels each having a port, a transparent layer supported on said spacers and sealed to said substrate, and a different colored UV cured epoxy filling each of said channels and located between all of the photosensitive devices in each said channel and the transparent layer.

5. A color-scanning array comprising:
(a) a generally flat housing having opposed generally flat top and bottom layer portions, edge portions and spacer portions, said edge and spacer portions being sealed to and between the top and bottom layer portions to form plural channels extending in rows parallel to one another, one of said top and bottom layer portions being transparent to radiation,
(b) each of said channels having means for introducing a flowable substance,
(c) a plurality of photosensor arrays each comprising separate devices responsive to said radiation, each of said arrays being located in one of said channels such as to provide a common space within the channel between said photosensitive devices of said array and said one transparent layer portion,
(d) a different colored flowable color medium filling the common space within each channel such that the color medium will act as a common filter for radiation passing through the said one transparent layer portion to the separate photosensitive devices in said channel.

6. The color-scanning array of claim 5, wherein the channels extend in parallel rows.

7. The color-scanning array of claim 6, wherein the means for introducing comprise ports to the channels.

8. The color-scanning array of claim 6, wherein the channels have dimensions of the order of micrometers.

9. The color-scanning array of claim 8, wherein the array comprises three channels.

* * * * *